United States Patent [19]

Yamada et al.

[11] Patent Number: 4,811,370
[45] Date of Patent: Mar. 7, 1989

[54] DIGITAL MUTING CIRCUIT

[75] Inventors: Kazuya Yamada, Yokosuka; Kazunori Nishikawa, Machida; Koji Tanaka, Yokohama, all of Japan

[73] Assignee: Victor Company of Japan Ltd., Yokohama, Japan

[21] Appl. No.: 112,489

[22] Filed: Oct. 26, 1987

[30] Foreign Application Priority Data

Oct. 27, 1986 [JP] Japan .................. 61-253678

[51] Int. Cl.⁴ .......................... G06F 11/10
[52] U.S. Cl. .................. 377/54; 375/104; 360/32
[58] Field of Search ............ 377/54, 20; 375/34, 375/104; 360/32

[56] References Cited

U.S. PATENT DOCUMENTS

| | | | |
|---|---|---|---|
| 4,291,405 | 9/1981 | Jayant et al. | 375/34 |
| 4,430,742 | 2/1984 | Milleker et al. | 375/104 |
| 4,637,036 | 1/1987 | Kobari | 375/34 |
| 4,682,332 | 7/1987 | Okamoto et al. | 360/32 |

*Primary Examiner*—John S. Heyman
*Attorney, Agent, or Firm*—Holman & Stern

[57] ABSTRACT

A first digital sound data of N-bits delivered from the input terminal is controlled by a mute control signal indicating either on-mute state signifying the state where mute operation is conducted or off-mute state signifying the state where no mute operation is conducted. This circuit includes a level control circuit, a register, a bit shift circuit, and a data selector. The level control circuit outputs a second digital sound data corresponding to the soundless state at the time of on-mute. It outputs data of which level gradually rises from the level of the soundless state to the level indicated by the first digital sound data at the beginning of off-mute and outputs the first digital duration at times subsequent thereto. Thus, for a duration at the beginning of off-mute, sound volume gradually rises. The register and the bit shift circuit gradually attenuate the first digital sound data to the level of the soundless state. Thus, for a duration at the beginning of on-mute, sound volume gradually lowers. The data selector selects the lowering operation by the time the above-mentioned rising operation is conducted, thus permitting a normal mute operation.

8 Claims, 5 Drawing Sheets

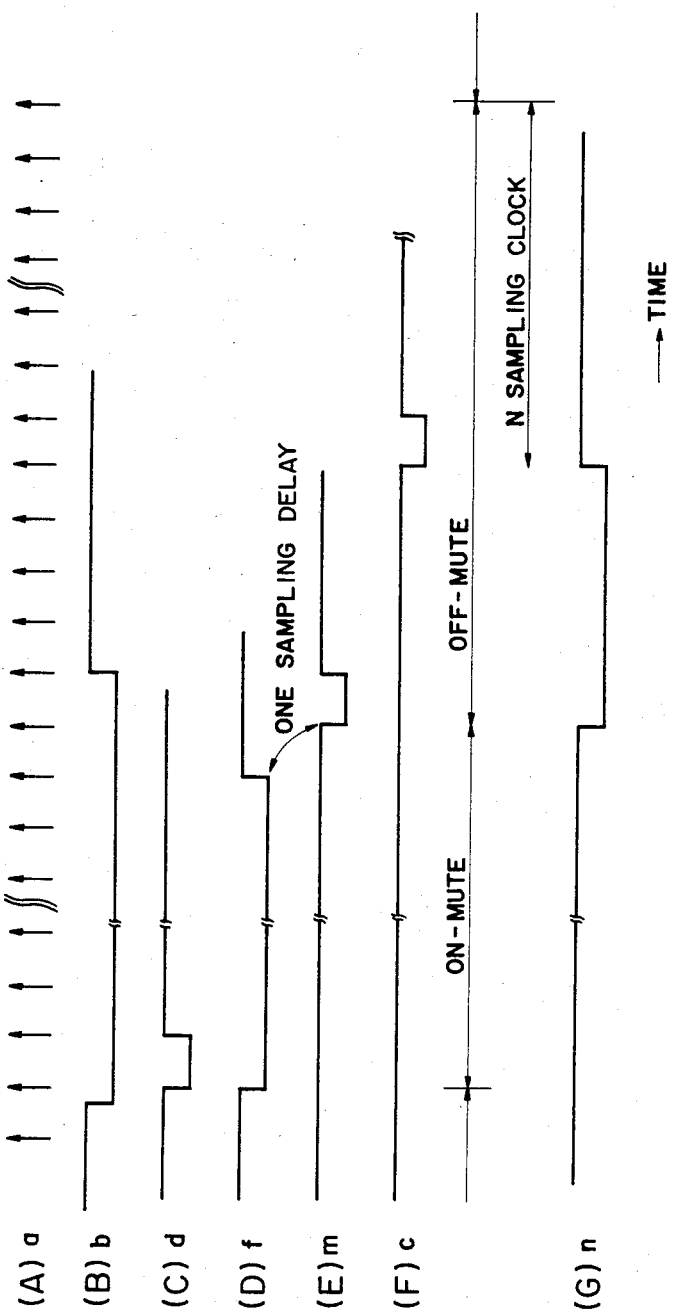
F I G. 5

DIGITAL MUTING CIRCUIT

BACKGROUND OF THE INVENTION

The present invention relates to a digital muting circuit, and more particularly to a digital muting circuit for muting sounds or aural data having been subjected to pulse code modulation (PCM) or releasing such muting.

There have been known in the art various digital audio signal recording and reproducing systems where a synchronizing signal, an error check code, and an error correction code etc. are added to audio data (PCM sound data). In these systems, the audio data are usually obtained by applying pulse code modulation to an analog sound signal and generating a block signal of a predetermined format in accordance with a modulation system suitable for recording and reproducing operations. The modulated sound signal thus obtained is recorded on a recording medium.

For such digital audio signal recording and reproducing systems, it is required to mute sound in compliance with intention of a user at the time of reproduction (which is also referred to as "on-mute"), or to release muting state to thereby return to the original sound output state (which is also referred to as "off-mute").

The muting circuit in conventional digital audio signal recording/reproducing systems has applied on-mute or off-mute to a reproduced analog sound signal obtained by applying digital-to-analog conversion to reproduced and demodulated PCM sound data using a D/A converter.

On the other hand, ICs (Integrated Circuits) may be reduced in cost to much extent by mass production. Further, digital ICs have various advantages such that they have resistance to power supply voltage change, noise, temperature change etc., and they are stable in performance in the prolonged use, and permit high reliable and stable operation. For this reason, it is advantageous to construct the above-mentioned muting circuit as a digital circuit, thereby permitting it to be incorporated into the digital IC. Such an implementation can realize non-adjustment.

SUMMARY OF THE INVENTION

The present invention has been made in view of the above and its object is to provide a digital muting circuit capable of applying on-mute and off-mute to PCM sound data.

The digital muting circuit according to the present invention includes: an input terminal for inputting a first digital sound data comprising data of N-bits (N is an integer equal to 2 or more); an input terminal for inputting a mute control signal indicating either on-mute state signifying the state where mute operation is conducted or off-mute state signifying the state where no mute operation is conducted; an input terminal for inputting a sampling clock having a predetermined time period; level control means; a register for holding a given data of N-bits thereafter to output it in synchronism with the sampling clock; shift means for inputting an output data of the register to shift the data thus inputted in a direction of lower order bits and to output it in synchronism with the sampling clock.

The above-mentioned level control means has a following function. Within a time period where the mute control signal indicates the on-mute state, it outputs a second digital sound data corresponding to soundless state. Within a time period where the mute control signal indicates the off-mute state, it outputs data which gradually vary with lapse of time from the level of the soundless state to the level that the first digital sound data indicate for a time period until a predetermined time elapses after the off-mute state is initiated and it outputs the first digital sound data after the predetermined time has elapsed.

In addition, there is provided selector means which has a function to input both the output data of the shift means and the output data of the level control means, whereby for a time period until a predetermined time elapses from a time point when the mute control signal has been brought into the on mute state, it selects the output data of the shift means to deliver the same to the register, and for a time period except for the above, it delivers the output data of the level control means to the register.

By taking out an output of the register as an output signal using such a circuit arrangement, level will be gradually changed immediately after the mute control signal changes, thus permitting natural muting operation from an aural point of view.

Another embodiment of the present invention may be implemented such that the level control means outputs the output data of the register in place of the first digital sound data and that the selector means inputs the first digital sound data instead of the output data of the level control means to deliver it to the register in place of the shift means. In this embodiment, an output of the level control means is to be taken out as an output signal.

BRIEF DESCRIPTION OF THE DRAWINGS

In the accompanying drawings:

FIG. 5 is a timing chart for explanation of the operation of the circuit shown in FIG. 4.

DESCRIPTION OF THE PREFERRED EMBODIMENTS

Figure 1:
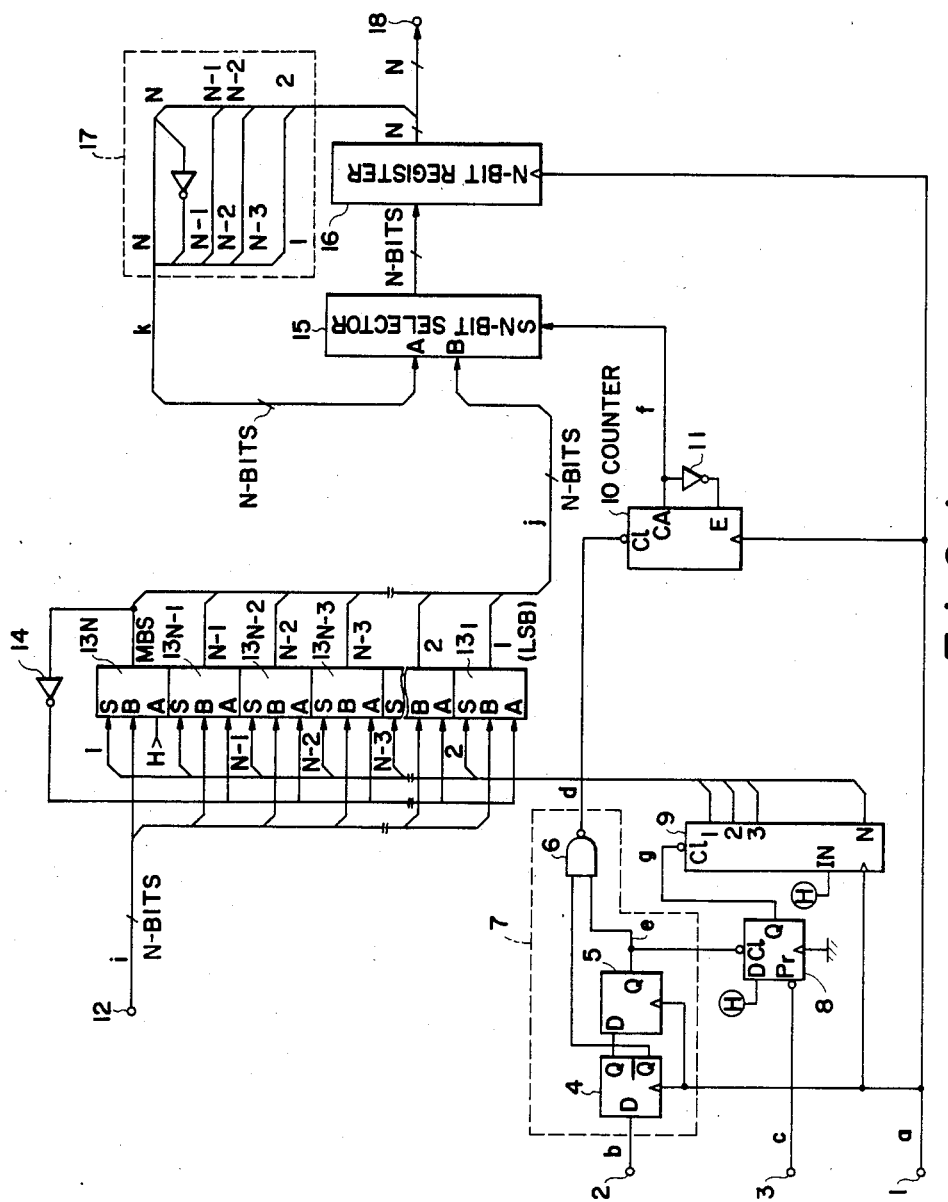
FIG. 1 is a circuit diagram showing one embodiment of the present invention.

FIG. 1 is a circuit diagram showing an embodiment of a digital muting circuit according to the present invention. In this figure, a sampling clock a incoming to an input terminal 1 at a timing shown in FIG. 2(A) in a model form is delivered to each clock terminal of D-type flip-flops 4 and 5 and a serial-to-parallel (S/P) converter 9, and to each clock terminal of an N-nary counter 10 and an N-bit register 16 which will be described later. This sampling clock a is incoming at a period equal to the transmission period of each word of a PCM sound data i having a number of quantized bits of N (N is an integer equal to 2 or more and e.g. N is 16) shown in FIG. 2(I).

A mute control signal b shown in FIG. 2(B) from an external control circuit (not shown) is incoming to an input terminal 2 and is applied to a data input terminal of the D-type flip-flop 4. This mute control signal b is a binary signal which assumes low level at the time of on mute and high level at the time of off-mute. Further, a mute release signal c, which assumes low level only at the time of releasing the on-mute state as shown in FIG. 2(C), is incoming to an input terminal 3 from the above-mentioned external control circuit.

The D-type flip-flops 4 and 5 form a circuit of two stages cascade-connected. From a Q output terminal of the D-type flip-flop 5, as shown in FIG. 2(E), a pulse e is taken out. The pulse e falls to low level at the second sampling clock after the mute control signal b fell to low level and rises to high level at the second sampling clock after the mute control signal b rose to high level. A NAND circuit 6 receives a $\overline{Q}$ output pulse of the D-type flip-flop 4 and the Q output pulse e of the flip-flop 5 to generate and output a pulse d as shown in FIG. 2(D).

Namely, the D-type flip-flops 4 and 5 and the NAND circuit 6 constitute an on-mute control signal generating circuit 7. This circuit 7 generates and outputs from the NAND circuit 6 a negative polarity pulse d of one sampling clock period width synchronous with the sampling clock a in phase (i.e., one word transmission period of the input PCM sound data i) immediately after the mute control signal b shifted to low level to apply the negative polarity pulse d to a clear terminal of the N-nary counter 10 to clear this counter. The N-nary counter 10 is constituted so that its carry output is applied to its enable terminal through an inverter 11. This counter 10 outputs, from its carry output terminal a pulse f (shown in FIG. 2(F) which shifts to low level from the time point when cleared by the above-mentioned negative polarity on mute control signal d and returns to high level at the time point when $(N-1)$ input sampling clocks a are counted. After the pulse f shifted to high level, the counter 10 stops its counting operation until a clear pulse is incoming next time.

A D-type flip-flop 8 is constituted so that it is preset by the above-mentioned negative mute release signal c and is cleared for a time period during which the pulse e is at low level. As shown in FIG. 2(G), this flip-flop 8 generates a pulse g which shifts to low level at the time point when the pulse e has shifted to low level and shifts to high level at the time point when the mute release signal c is incoming after the pulse e shifted to high level to apply the pulse g to the clear terminal of the P/S converter 9.

Since the S/P converter 9 is cleared for a time period during which the above-mentioned pulse g is at low level, respective output signals of output terminals of N-bits are all at low level. Thus, at the time point when the first sampling clock immediately after the pulse g shifted to high level is inputted, the S/P converter 9 produces a signal of high level from its output terminal labeled "1" to output it to the select terminal of a data selector $13_N$ as shown in FIG. 2(H). Further, at the time when the second sampling clock a is incoming, the S/P converter 9 produces a signal of high level from its output terminal labeled "2" to output it to the select terminal of a data selector $13_1$ as shown in FIG. 2(H). At times subsequent thereto, every time a single sampling clock a is incoming, the S/P converter 9 produces signals of high level in turn from the third to N-th terminals as shown in FIG. 2(H) to output them to select terminals of the data selectors $13_2$ to $13_{N-1}$, respectively.

The data selectors $13_1$ to $13_N$ are circuits of the two-input, one-output type. Each selector is constituted so that when the input level of the select terminal is low, it selects and outputs the input data of the input terminal A, while when the input level of the select terminal is high, it selects and outputs the input data of the input terminal B. The reproduced PCM sound data i which has been reproduced from, e.g., a recording medium and then has been undergone all of de-interleaving, time axis compression, jitter absorption, and error detection and correction etc. is inputted through an input terminal 12 to respective input terminals B of the data selectors $13_1$ to $13_N$ every corresponding bits.

Namely, MSB of the PCM sound data is inputted to the input terminal B of the data selector $13_N$ and LSB of the PCM sound data is inputted to the input terminal B of the data selector $13_1$. This PCM sound data have the number of quantized bits of N. As shown in FIG. 2(I) in a model form, they are inputted in the original order as indicated by the $(M-3)$th one word data ($_{M-3}D_N$ to $_{M-3}D_1$), the $(M-2)$th one word data ($_{M-2}D_N$ to $_{M-2}D_1$), the $(M-1)$th one word data ($_{M-1}D_N$ to $_{M-1}D_1$), the Mth one word data ($_MD_N$ to $_MD_1$) . . . Namely, $_AD_B$ in FIG. 2(I) and FIGS. 3(A) to 3(C), which will be described later, indicates the PCM sound data of the Bth bit of the Ath word. In this embodiment, an explanation will be made on the assumption that the code form of the PCM sound data is offset binary.

The data selector assembly has an arrangement such that a signal of high level H is always inputted to the input terminal A of the data selector $13_N$ among respective input terminals A of the data selectors $13_1$ to $13_N$, and that data obtained by applying polarity inversion to the output data of the data selector $13_N$ using the inverter 14 is delivered to each input terminal A of the other data selectors $13_1$ to $13_{N-1}$.

Thus, respective output data of the data selectors $13_N$, $13_{N-1}$, . . . $13_1$ are outputted in a manner that data Of MSB of the input PCM sound data i, data of the $(N-1)$th bit thereof, . . . , data of LSB thereof are selectively outputted during the off-mute period until the above-mentioned pulse g shifts to low level, as shown in FIG. 3(A) in a model form. When this pulse g shifts to low level (this time point is indicated by GL at the upper portion of FIG. 3(A)), all the outputs of N-bits of the S/P converter 9 shift to low level. As a result, the output data of the data selector $13_N$ shifts to high level (logical "1") which is the level of a signal incoming to its input terminal A. Further, respective output data of the data selectors $13_{N-1}$ to $13_1$ shift to low level (logical "0") which is the level of a signal obtained by applying polarity conversion to the output high level of the data selector $13_N$ using the inverter 14 which is incoming to each input terminal A of the data selectors $13_{N-1}$ to $13_1$.

Accordingly, the value of the PCM sound data j of N-bits in total taken from the data selectors $13_N$ to $13_1$ at the time of on-mute is indicated by "1000 . . . 0" as shown in FIG. 3(A). Thus, only the value of MSB which indicates the porality the PCM sound data assumes "1" and all the values of $N-1$ bits except for the former assume "0", and the value of the PCM sound data j is held at this value during the on-mute period. This value represents "0" as well known in terms of offset binary, i.e., ground potential.

When the above-mentioned pulse g shifts from low level to high level (this time point is indicated by GH at the upper portion of FIG. 3(A)), every time a single sampling clock a is incoming as stated above, the outputs of the S/P converter 9 shift to high level in sequence as indicated by FIG. 2(H). Thus, the data selectors $13_N$ to $13_1$ are switched so that the data selector $13_N$ first selects and outputs the input PCM sound data i of the input terminal B in synchronism with the sampling clock a. At times subsequent thereto, they are switched so as to select and output the input PCM sound data i in order of the data selectors $13_1$, $13_2$, . . . , $13_{N-1}$ every time the sampling clock a is incoming. Thus, the value of the PCM sound data j of N-bits in total taken from the data selectors $13_N$ to $13_1$ changes as shown in FIG. 3(A).

Namely, after the off-mute, the value of the PCM sound data j assumes "1000 . . . 0" at the first time and then becomes equal to a value of N-bits in total comprising MSB which is the same value as the value $_pD_N$ Of MSB of the input PCM sound data i and remaining N−1 bits which are equal to the value $_p\overline{D}_N$ of an inverted output of the MSB (this value indicates ground potential or an extremely small potential which is a value shifted on the negative side by a level corresponding to one quantization step with respect to the ground potential). Then, the values of MSB and LSB become equal to $_{P+1}D_N$ and $_{P+1}\overline{D}_1$, which are the values of MSB and LSB of the input PCM sound data i, respectively, and other N−2 bits assume $_{P+1}\overline{D}_N$ which is a value of an inverted output of MSB. This value is an extremely small potential shifted on the positive side by a level corresponding to one bit of LSB with respect to the ground potential or an extremely small potential shifted on the negative side by a level corresponding to two quantization steps with respect to the ground potential.

At times subsequent thereto, in a manner similar to the above, for the value of the PCM sound data j, such data are taken out that comprises MSB of which value is equal to that of the MSB of the PCM sound data i, and bits except for MSB of which values vary with lapse of time so as to become equal to corresponding bits of the input PCM sound data i bit by bit from LSB in a direction of higher order bits. Namely, from the time point of the off-mute, the PCM sound data j of which its level gradually returns from the minimum level to the level indicated by the input PCM sound data i are taken out, and then are applied to the input terminal B of the N-bit selector 15.

An N-bit selector 15 is constructed so that when the above-mentioned pulse f is at low level, it selects and outputs the input data of the input terminal A while when at high level, it selects and outputs the input data of the input terminal B. An N-bit register 16 stores and holds the parallel output PCM sound data of N-bits from the N-bit register 15 every time the sampling clock a is incoming and outputs the N-bit PCM sound data which have been stored when a preceding sampling clock is incoming, to a shift circuit 17 and to an output terminal 18. The shift circuit 17 outputs only MSB of the input N-bit data as MSB as it is, outputs data obtained by applying polarity inversion to the data of MSB of the input N-bit data as data of the second bit of higher order, and shifts bit by bit in a direction of lower order data of N−2 bits in total from the second bit of higher order to the second bit of lower order of the input N-bit data to output them to the input terminal A of the N-bit selector 15.

Thus, for the off-mute period during which the above-mentioned pulse f is at high level, the output signal of the N-bit register 16 becomes the PCM sound data l obtained by delaying the input PCM sound data i by one sampling clock as shown in FIG. 3(C) in a model form. Further, when the above-mentioned pulse f shifts to low level by the application of on-mute (the time point when this pulse f has just shifted to low level is indicated by FL at the upper portion of FIG. 3(A)), for one sampling clock period immediately after the pulse f has shifted to low level, the PCM sound data i of one sampling clock immediately therebefore (indicated by $_{M-1}D_N$, $_{M-1}D_{N-1}$, . . . , $_{M-1}D_1$ in FIG. 2(I)) is outputted from the N-bit register 16 as shown in FIG. 3(C). After one sampling clock period from the time point when the pulse f has shifted to low level, the input PCM sound data k of the input terminal A of the N-bit selector 15 is initiated to be outputted through the output terminal 18 with delay of one sampling clock period.

Namely, during a low level period of the pulse f after one sampling clock period from the time point when the pulse f has shifted to low level (this duration is indicated by $T_{ON}$ at the bottom portion of FIG. 3(C)), as shown in FIG. 3(B), the value of MSB of the output PCM sound data k of the shift circuit 17 is fixed to $_{M-1}D_N$, whereas the value $_{M-1}\overline{D}_N$ having a polarity opposite to that of the value $_{M-1}D_N$ of MSB shifts in a direction of lower order bits in synchronism with the sampling clock a. Thus, after N−1 sampling clocks, only the value of MSB is $_{M-1}D_N$ and all the values of the remaining N−1 bits become $_{M-1}\overline{D}_N$ (viz., "1000 . . . 0" or "0111 . . . 1").

Thus, during the above duration $T_{ON}$, the PCM sound data k is taken out from the shift circuit 17 as data of which value gradually decays by approximately −6 dB per each sampling clock. The PCM sound data k thus obtained is delivered to the input terminal A of the N-bit selector 15, and is then delivered to the N-bit register 16 via the N-bit selector 15. Accordingly, during the above time duration $T_{ON}$, as shown in FIG. 3(C) in a model form, the output PCM sound data k of the N-bit register 16 becomes data obtained by delaying the PCM sound data k by one sampling clock period. The data thus obtained is then delivered to a D/A converter (not shown) via the output terminal 18. Thus, at the time of transition to on-mute, the output PCM sound data is not instantaneously muted to the minimum level, but gradually decays by approximately −6 dB per each sampling clock to reach the minimum level. Thus, this can prevent noise produced when muting is suddenly applied.

Further, when the above-mentioned pulse f shifts from low level to high level by the count of N−1 sampling clocks (this time point is indicated by FH at the upper portion of FIG. 3(A)), the N-bit selector 15 is switched so as to output the input data of the input terminal B. Thus, after one sampling clock from this time point, the value "1000 . . . 0" of the PCM sound data j is taken out from the N-bit register 16. Namely, the N-bit register 16 begins outputting, as shown in FIG. 3(C) in a model form, the value "1000 . . . 0" indicative of the ground potential after one sampling clock at the time point when the pulse f has shifted to high level, and continues to output this value indicative of the ground potential until one sampling clock period immediately after the pulse g has shifted to high level by the mute release signal C.

For N−1 sampling clock periods from the first sampling clock immediately after the pulse g has shifted to high level (this duration is indicated by $T_{OFF}$ at the bottom portion of FIG. 3(C)), the output of the S/P converter 9 shifts to high level in accordance with a predetermined sequence as previously described. Thus, as shown in FIG. 3(C) in a model form, the PCM sound data i at this time is initiated to be outputted as the output PCM sound data l from the N-bit register 16 with delay of one sampling clock period. As previously described, the PCM sound data during the duration $T_{OFF}$ varies in a manner that its level gradually returns from the minimum level to the level of the input PCM sound data i. Accordingly, even at the time of transition to the off-mute, the muting is not instantaneously released, but gradual returning to the ordinary level is conducted, thus making it possible to prevent occurrence of noise.

After the above duration $T_{OFF}$ has elapsed, until the next on-mute control signal d is produced, output signals of N-bits of the S/P converter 9 are all placed in high level. Thus, the input PCM sound data i passes through the selectors $13_1$ to $13_1$ as it is, and is then outputted to the output terminal 18 as it is via the N-bit selector 15 and the N-bit register 16.

Figure 2:
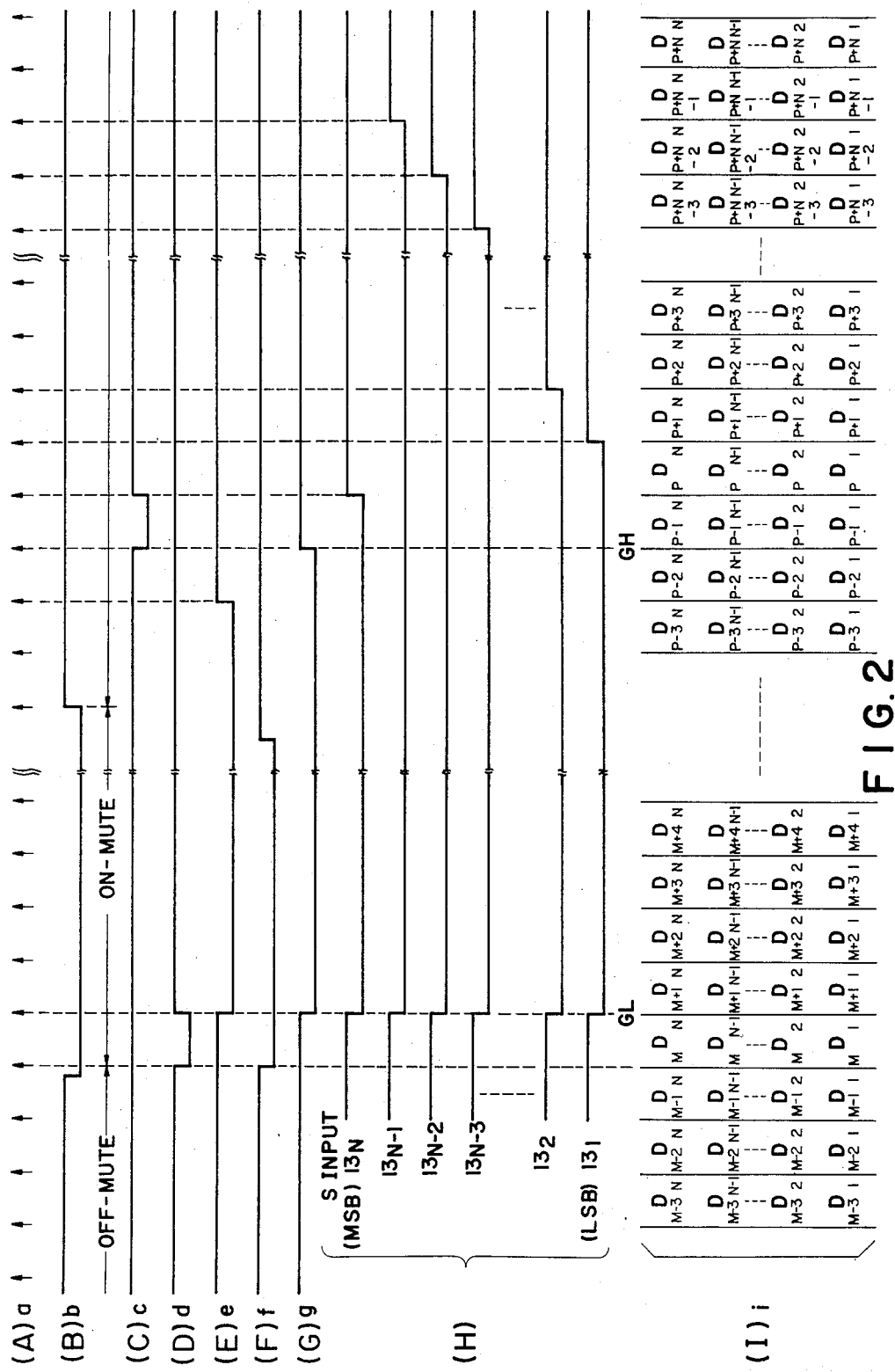
FIGS. 2 and 3 are timing charts for explanation of the operation of the circuit shown in FIG. 1, respectively.
Figure 4:
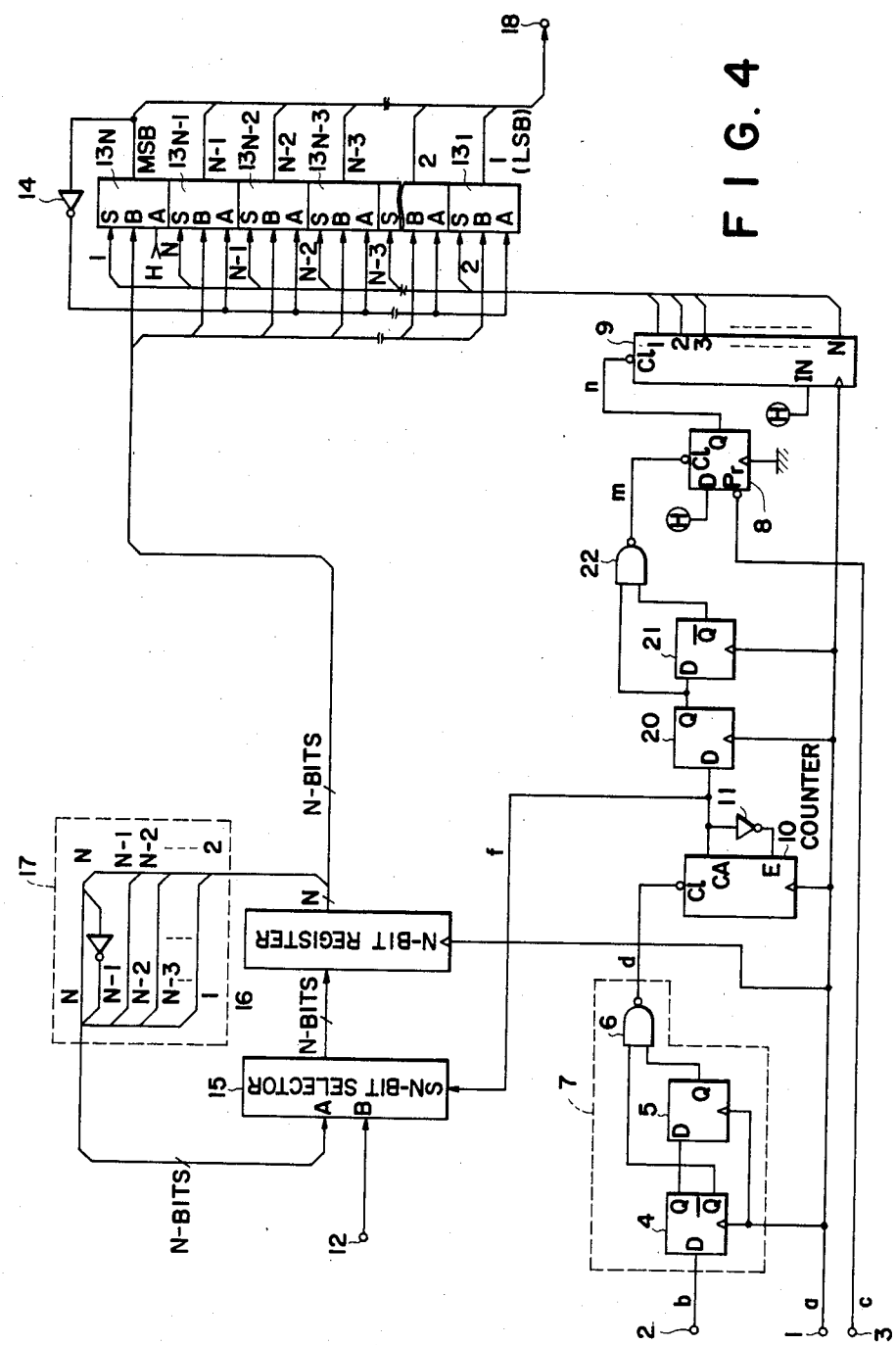
FIG. 4 is a circuit diagram showing another embodiment of the present invention.

Another embodiment of a circuit according to the present invention will be now described with reference to FIGS. 4 and 5. In FIG. 4, components identical to those in FIG. 1 are respectively designated by like reference numerals and their explanation will be omitted. Further, in FIG. 5, signals identical to those in FIG. 2 are respectively designated by like reference numerals and their explanation will be omitted.

In FIG. 4, the output pulse f of the counter 10 is applied to the data input terminal of a D-type flip-flop 20 of a flip-flop circuit which comprises two stages of cascade-connected D-type flip-flops 20 and 21. A NAND circuit 22 performs not-logical-product of the Q output of the D-type flip-flop 20 and the $\bar{Q}$ output of the D-type flip-flop 21 to generate a negative polarity pulse m having one sampling clock width which falls at time point delayed by one sampling clock from the time point of the rise of the pulse f as shown in FIG. 5(E) to apply this pulse m to the clear terminal of the D-type flip-flop 8.

Thus, the D-type flip-flop 8 produces as shown in FIG. 5(G) from the Q output terminal thereof a pulse n which falls at the incoming time point of the above-mentioned pulse m and rises at the incoming time point of the mute release signal c to apply this pulse n to the clear terminal of the S/P converter 9. As previously described, the S/P converter 9 outputs from its N-bit output terminals a pulse which shifts to high level in sequence for N sampling clock periods from the time point when the pulse n has shifted to high level.

Figure 3:
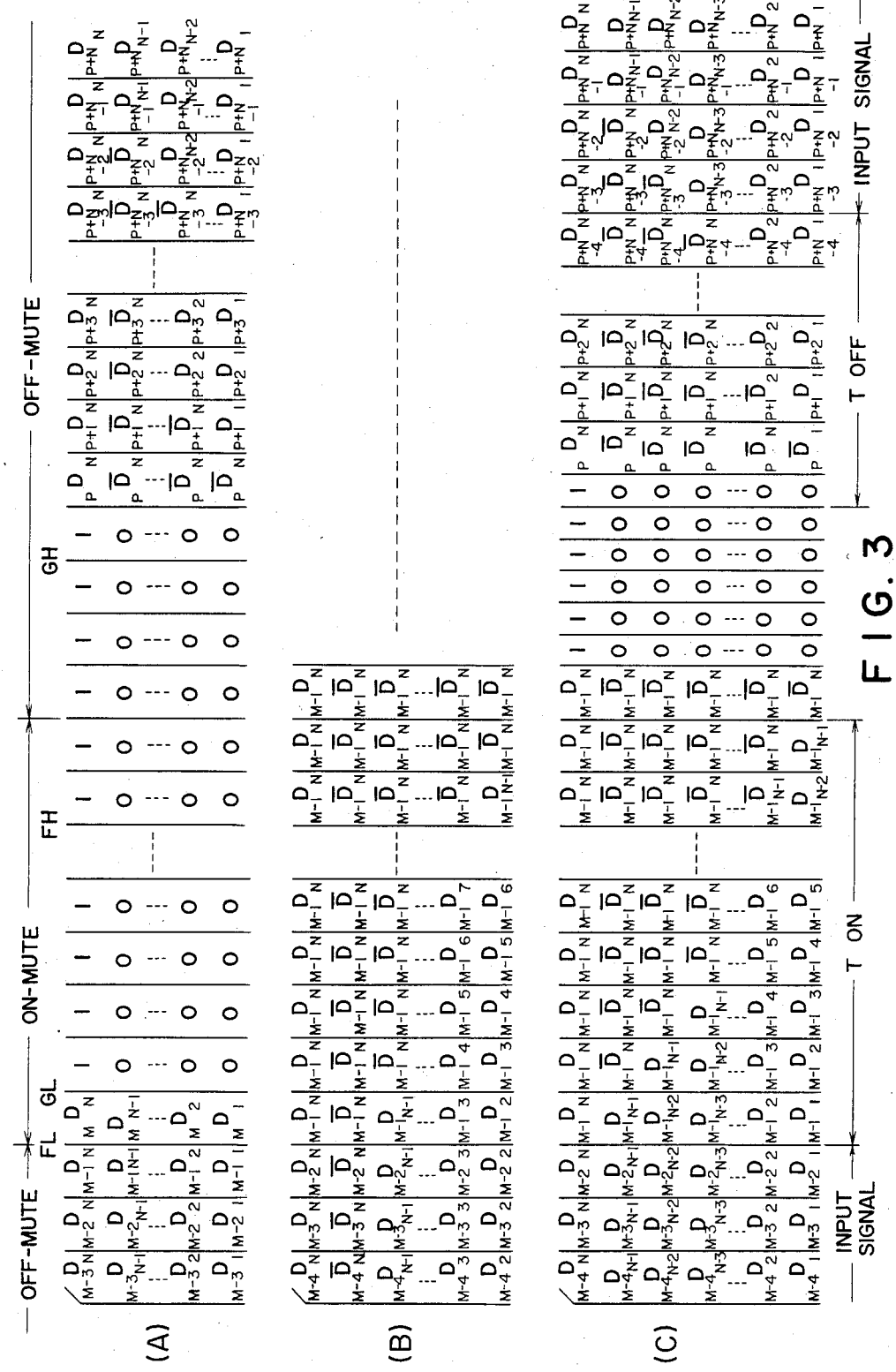

This embodiment provides a reciprocal arrangement of the input and output units in FIG. 3 by addition of the D-type flip-flops 20 and 21 and the NAND circuit 22. This embodiment can output the PCM sound data to which the mute processing has been implemented similar to that in the above-mentioned embodiment of FIG. 1 to the output terminal 18.

It is to be noted that the present invention is not limited to the above-mentioned embodiments, and hence the PCM sound data may have other code forms, e.g., twos complement notation etc. In case of the twos complement notation, the inverter 14 and the inverter in the shift circuit 17 are removed, and the inputs and the outputs thereof are directly coupled.

As described above, the present invention can carry out on and off of muting with respect to the PCM sound data using a digital circuit configuration, thus making it possible to incorporate the muting circuit into ICs. When compared to the analog muting circuit, the digital muting circuit implemented as IC has a greater resistance to change of power supply voltage, noise, temperature change, secular change and the like, and high reliability, and makes it possible to realize non-adjustment implementation, to reduce parts externally attached, and to be constructed at low cost and in a small size. Further, since this digital muting circuit is constituted so that level gradually changes immediately after on mute and immediately after off-mute, noise produced when suddenly changing the level can be prevented and thus on/off operation of muting natural from an aural point of view can be conducted.

What is claimed is:

1. A digital muting circuit including:
    an input terminal for inputting a first digital sound data comprising data of N-bits (N is an integer equal to 2 or more);
    an input terminal for inputting a mute control signal indicating either on-mute state signifying the state where mute operation is conducted or off-mute state signifying the state where no mute operation is conducted;
    an input terminal for inputting a sampling clock having a predetermined time period;
    level control means for outputting a second digital sound data corresponding to soundless state within a time period where said mute control signal indicates the on-mute state, for outputting data which gradually vary with lapse of time from the level of said soundless state to the level that said first digital sound data indicate for a time period until a predetermined time elapses after said off-mute state is initiated within a time period where said mute control signal indicates said off-mute state, and for outputting said first digital sound data after the predetermined time has elapsed;
    a register for holding a given data of N-bits thereafter to output it in synchronism with said sampling clock;
    shift means for inputting an output data of said register to shift said data thus inputted in a direction of lower order bits to output it in synchronism with said sampling clock; and
    selector means for inputting both an output data of said shift means and an output data of said level control means, whereby for a time period until a predetermined time elapses from a time point when said mute control signal has been brought into said on-mute state, it selects said output data of said shift means to deliver the same to said register, and for a time period except for the above, it delivers said output data of said level control means to said register, thus taking out the output of said register as an output signal.

2. A digital muting circuit as set forth in claim 1, wherein said level control means includes a serial-to-parallel converter for outputting N kinds of rectangular waves having the same starting points and terminating points different from each other, and N data selectors for inputting said N kinds of rectangular waves, respectively, and wherein each of said data selectors initiates the output of said first digital sound data in synchronism with said terminating point of each of said input rectangular waves.

3. A digital muting circuit as set forth in claim 1, wherein said selector means includes a counter for measuring a predetermined time.

4. A digital muting circuit as set forth in claim 1, wherein flip-flops for synchronizing said mute control signal with said sampling clock are connected to said input terminal for inputting said mute control signal.

5. A digital muting circuit including:

an input terminal for inputting a first digital sound data comprising data of N-bits (N is an integer equal to 2 or more);

an input terminal for inputting a mute control signal indicating either on-mute state signifying the state where mute operation is conducted or off-mute state signifying the state where no mute operation is conducted;

an input terminal for inputting a sampling clock having a predetermined time period;

a register for holding a given data of N-bits thereafter to output it in synchronism with said sampling clock;

level control means for outputting a second digital sound data corresponding to soundless state within a time period where said mute control signal indicates the on-mute state, for outputting data which gradually vary with lapse of time from the level of said soundless state to the level that said first digital sound data indicate for a time period until a predetermined time elapses after said off-mute state is initiated within a time period where said mute control signal indicates said off-mute state, and for outputting an output data of said register after said predetermined time has elapsed;

shift means for inputting said output data of said register to shift said data thus inputted in a direction of lower order bits to output it in synchronism with said sampling clock; and selector means for inputting both an output data of said shift means and said first digital sound data, whereby for a time period until a predetermined time elapses from a time point when said mute control signal has been brought into said on-mute state, it selects said output data of said shift means to deliver the same to said register, and for a time period except for the above, it delivers said first digital sound data to said register, thus taking out the output of said level control means as an output signal.

6. A digital muting circuit as set forth in claim 5, wherein said level control means includes a serial-to-parallel converter for outputting N kinds of rectangular waves having the same starting points and terminating points different from each other, and N data selectors for inputting said N kinds of rectangular waves, respectively, and wherein each of said data selectors initiates the output of said output data of said register in synchronism with said terminating point of each of said input rectangular waves.

7. A digital muting circuit as set forth in claim 5, wherein said selector means includes a counter for measuring a predetermined time.

8. A digital muting circuit as set forth in claim 5, wherein flip-flops for synchronizing said mute control signal with said sampling clock are connected to said input terminal for inputting said mute control signal.

* * * * *